United States Patent
Kim et al.

(10) Patent No.: US 10,726,895 B1
(45) Date of Patent: Jul. 28, 2020

(54) CIRCUIT METHODOLOGY FOR DIFFERENTIAL WEIGHT READING IN RESISTIVE PROCESSING UNIT DEVICES

(71) Applicant: International Business Machines Corporation, Armonk, NY (US)

(72) Inventors: Seyoung Kim, Mount Kisco, NY (US); Tayfun Gokmen, Briarcliff Manor, NY (US); Hyung-Min Lee, Seoul (KR); Wilfried Haensch, Somers, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 16 days.

(21) Appl. No.: 16/241,606

(22) Filed: Jan. 7, 2019

(51) Int. Cl.
| | | |
|---|---|---|
| *G06N 3/063* | (2006.01) | |
| *G06F 13/18* | (2006.01) | |
| *G11C 11/00* | (2006.01) | |
| *G11C 11/56* | (2006.01) | |
| *G11C 11/16* | (2006.01) | |
| *H01L 27/22* | (2006.01) | |
| *G11C 16/28* | (2006.01) | |
| *G11C 13/00* | (2006.01) | |
| *G11C 15/00* | (2006.01) | |

(52) U.S. Cl.
CPC ........ *G11C 11/1673* (2013.01); *G11C 13/004* (2013.01); *G11C 16/28* (2013.01); *H01L 27/226* (2013.01); *G06N 3/063* (2013.01); *G06N 3/0635* (2013.01); *G11C 13/0002* (2013.01); *G11C 15/00* (2013.01)

(58) Field of Classification Search
CPC ... G11C 11/1673; G11C 13/004; G11C 16/28; H01L 27/226

USPC .......................................................... 706/33
See application file for complete search history.

(56) References Cited

U.S. PATENT DOCUMENTS

| | | |
|---|---|---|
| 6,256,247 B1 | 7/2001 | Perner |
| 6,700,819 B2 | 3/2004 | Pascucci |
| 6,760,265 B2 | 7/2004 | La Rosa |
| 6,826,079 B2 | 11/2004 | Tran |
| 7,277,320 B2 | 10/2007 | Ezaki et al. |
| 7,859,906 B1 | 12/2010 | Vispute |
| 8,154,903 B2 | 4/2012 | Jung et al. |
| 9,472,245 B2 | 10/2016 | Lee et al. |
| 10,340,002 B1 * | 7/2019 | Kim .................... G06N 3/0635 |
| 2014/0063927 A1 | 3/2014 | Willey |

FOREIGN PATENT DOCUMENTS

KR   1020140004013   1/2014

\* cited by examiner

*Primary Examiner* — Ly D Pham
(74) *Attorney, Agent, or Firm* — Amin, Turocy & Watson, LLP

(57) ABSTRACT

A system, comprising: a memory that stores computer-executable components; a processor, operably coupled to the memory, that executes the computer-executable components stored in the memory, wherein the computer-executable components comprise: an expression component that expresses the read current range in an RPU as read current Iwmin and Iwmax, a constant current source component that generates a reference current I, a computing component that subtracts the reference current value within from the read current value to generate an active net current read value that is negative, positive or null; a weighting component that analyzes the active current value and assigns it to a negative, positive or null weight.

20 Claims, 8 Drawing Sheets

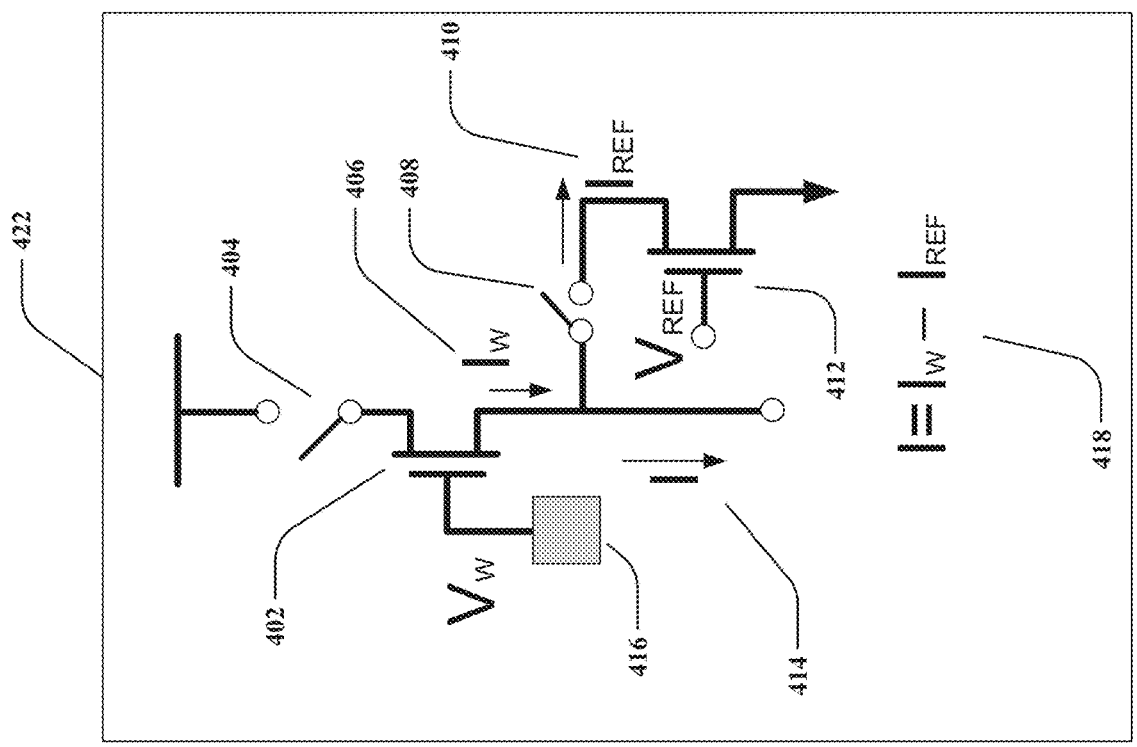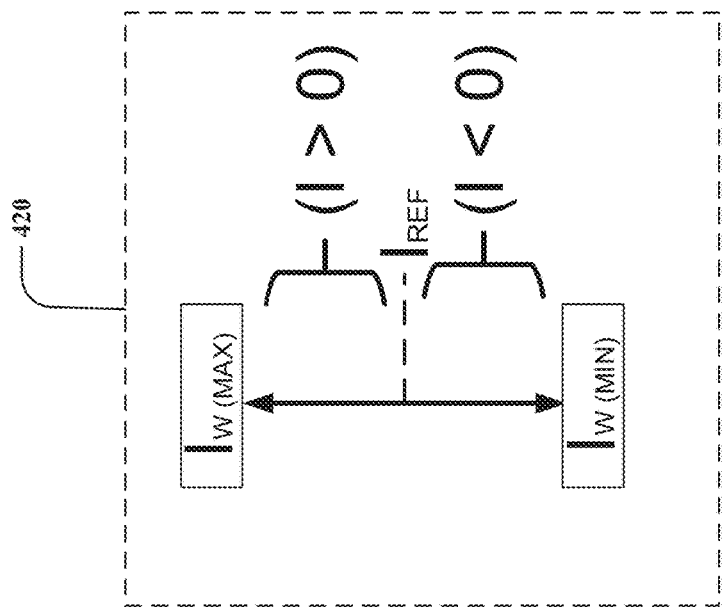
FIG. 4

CIRCUIT METHODOLOGY FOR DIFFERENTIAL WEIGHT READING IN RESISTIVE PROCESSING UNIT DEVICES

TECHNICAL FIELD

The subject disclosure relates generally to differential weight reading in resistive processing unit (RPU) devices.

SUMMARY

The following presents a summary to provide a basic understanding of one or more embodiments of the invention. This summary is not intended to identify key or critical elements, delineate scope of particular embodiments or scope of claims. Its sole purpose is to present concepts in a simplified form as a prelude to the more detailed description that is presented later. In one or more embodiments described herein, systems, computer-implemented methods, apparatus and/or computer program products that facilitate the reading of differential weights in a Resistive Processing Device (RPU). For the content below, a subscript shall represent the value of that primary identifier, e.g. (for example a reference current can be represented as ($I_{ref}$), where the primary identifier is I for current and "ref" refers to the reference current.

In accordance with an embodiment, a system, comprises: a memory that stores computer-executable components; a processor, operably coupled to the memory, that executes the computer-executable components, wherein the computer-executable components comprise: an expression component that expresses read current range in an RPU as read current $I_{wmin}$ (defined as the device read minimum current) and $I_{wmax}$ (defined as the device read maximum current); a constant current source component that generates a reference current $I_{ref}$ (defined as the reference current); a computing component that subtracts the reference current value from the read current value to generate an active net current read value that is negative, positive or null; and a weighting component that analyzes the active current value and assigns it to a negative, positive or null weight.

In accordance with an embodiment a computer-implemented method comprises: expressing, by a processor operatively coupled to a memory, read current range in a resistive processing unit (RPU) as read current $I_{wmin}$ and $I_{wmax}$; employing by the processor two FETs that work in opposite direction to each other to drive a current read differential that produces $I_{w+}$ and $I_{w-}$; calculating, by the processor, net active current I as ($I_{w+}-I_{w-}$); and analyzing, by the processor, net active current value and assigning it to a negative, positive or "0" weight.

DESCRIPTION OF THE DRAWINGS

FIG. 4 illustrates one method for differential reading, which is using a voltage source to generate the constant current source $I_{ref}$ in accordance with one or more embodiments described herein.

DETAILED DESCRIPTION

Figure 1:
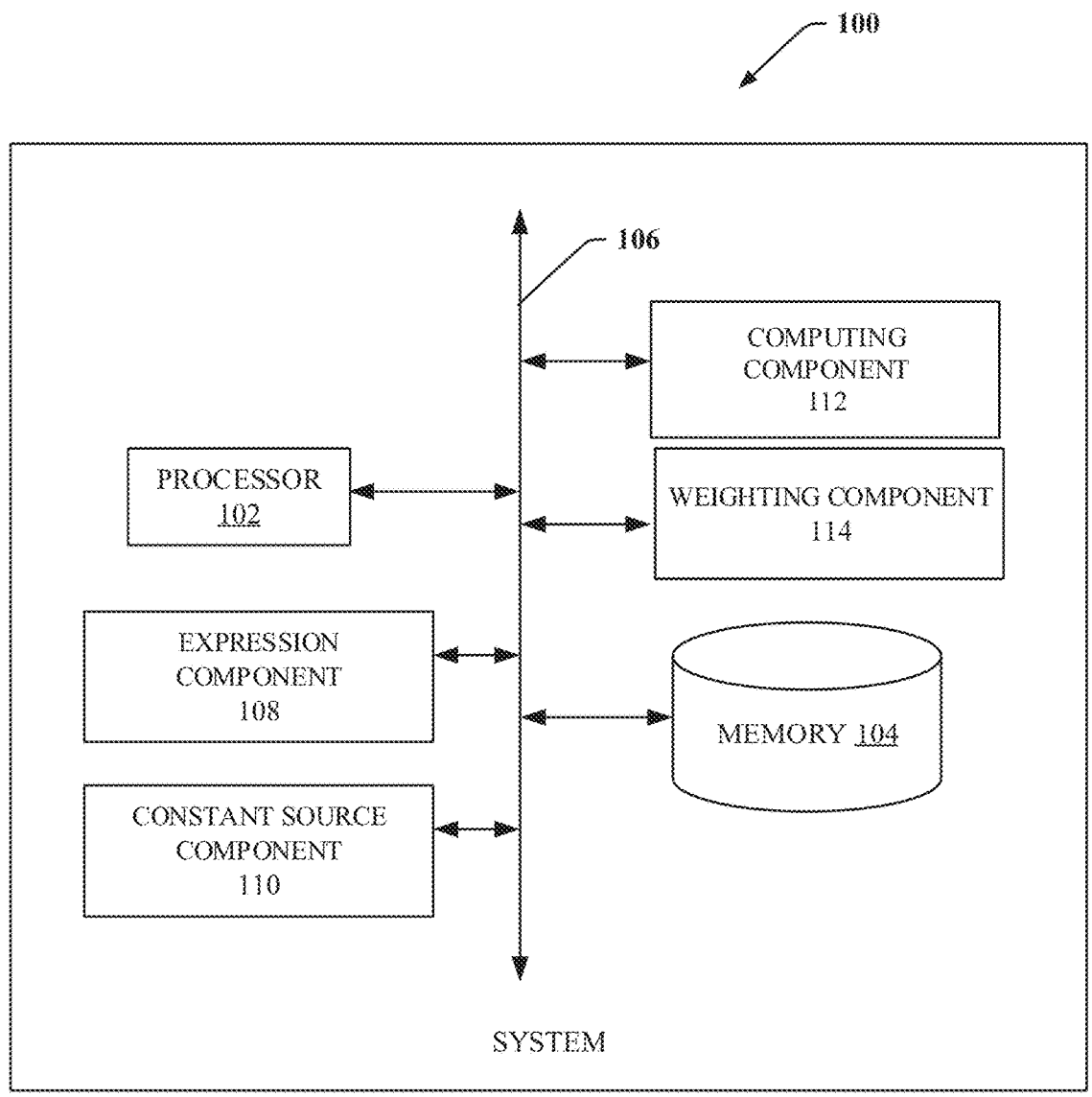
FIG. 1 illustrates a block diagram of an example system that can function as a RPU (Resistive Processing Unit) in accordance with one or more embodiments described herein.

The following detailed description is merely illustrative and is not intended to limit embodiments and/or application or uses of embodiments. Furthermore, there is no intention to be bound by any expressed or implied information presented in the preceding Summary section, or in the Detailed Description section. One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident; however, in various cases, that the one or more embodiments can be practiced without these specific details.

In recent years, deep neural networks (DNN) have demonstrated significant business impact in large scale analysis and classification tasks such as speech recognition, visual object detection, pattern extraction, etc. Training of large DNNs, however, is universally considered as a time consuming and computationally intensive task that demands datacenter-scale computational resources recruited for many days.

Various problems such as character recognition and image recognition by a computer are known to be well handled by machine-learning techniques. "Machine learning" is used to broadly describe a primary function of electronic systems that learn from data. In machine learning and cognitive science, neural networks are a family of statistical learning models inspired by the biological neural networks of animals, and in particular the brain. Neural networks can be used to estimate or approximate systems and functions that depend on a large number of inputs and are generally unknown. Neural networks use a class of algorithms based on a concept of inter-connected "neurons." In a typical neural network, neurons have a given activation function that operates on the inputs. By determining proper connection weights (a process also referred to as "training"), a neural network achieves efficient recognition of a desired patterns, such as images and characters. Oftentimes, these neurons are grouped into "layers" to make connections between groups more obvious and to each computation of values. Deep neural networks (DNNs) can be taught nearly anything but are highly intensive computing processes. A problem is that training AI systems ties up big-ticket supercomputers or data centers for days at a time. Scientists in the industry are constantly trying to reduce horsepower needs and learning times drastically by utilizing many different configurations and variances of electrical circuits.

As mentioned above, a primary difficulty is the level of computing power and time to teach the AI network. The problem is that modem neural networks must perform billions of tasks in parallel. That requires numerous central processing units (CPU) memory calls, which quickly adds up over billions of cycles. Recent implementations have a problem where estimated acceleration factors are limited by device specifications intrinsic to their application as NVM (non-volatile memory) cells. Device characteristics usually considered beneficial or irrelevant for memory applications such as high on/off ratio, digital bit-wise storage, and asymmetrical set and reset operations are becoming limitations for acceleration of DNN training. These non-ideal device characteristics can potentially be compensated with a proper design of peripheral circuits and a whole system, but only partially and with a cost of significantly increased operational time.

Scientists are searching for technology that can use new storage processes, e.g., like resistive random-access memory (RAM) that can permanently store data with DRAM-like speeds. In effort to improve performance, embodiments provide for a new type of chip, a resistive processing unit (RPU), that places large amounts of resistive RAM directly onto a CPU, and a method to read weights within the RPU.

The resistive processing unit (RPU) device can accelerate DNN training by orders of magnitude while using much less power than conventional devices. The RPU device can store and update weight values locally thus minimizing data movement during training and allowing to exploit locality and parallelism of training algorithm(s). The RPU provides configurable system parameters for implementation of an accelerator chip for DNN training in for example Complementary Metal-Oxide-Semiconductor (CMOS)-compatible technology. For large DNNs, with about 1 billion weights, this massively parallel RPU architecture can achieve acceleration factors of 30,000× compared to state-of-the-art microprocessors, while providing power efficiency of 84,000 Giga operations (GigaOps/sW). Problems that currently require days of training on a datacenter-size cluster with thousands of machines can potentially be addressed within hours on a single RPU accelerator. The RPU array can perform vector-matrix multiplication in an analog domain and parallel fashion, which can lead to 10,000× of performance boost compared to conventional CPU/GPU counterpart(s). A system consisting of a cluster of RPU accelerators will be able to tackle Big Data problems with trillions of parameters that is not possible to address presently using conventional technology, e.g., natural speech recognition and translation between all world languages, real-time analytics on large streams of business and scientific data, integration, and analysis of multimodal sensory data flows from a massive number of Internet of Things (IoT) sensors.

Artificial neural networks (ANNs) can be formed from crossbar arrays of RPUs that provide local data storage and local data processing without the need for additional processing elements beyond the RPU. The trainable resistive crosspoint devices are referred to as resistive processing units (RPUs).

Crossbar arrays (crosspoint arrays or crosswire arrays) are high density, low cost circuit architectures used to form a variety of electronic circuits and devices, including ANN architectures, neuromorphic microchips and ultra-high density nonvolatile memory. A basic crossbar array configuration includes a set of conductive row wires and a set of conductive column wires formed to intersect the set of conductive row wires. The intersections between the two sets of wires are separated by so-called crosspoint devices, which may be formed from thin film material.

Crosspoint devices, in effect, function as the ANN's weighted connections between neurons. Nanoscale two-terminal devices, for example memristors (defined as a non-linear passive two-terminal electrical component) having conduction state switching characteristics, are often used as the crosspoint devices to emulate synaptic plasticity with high energy efficiency. The conduction state (e.g., resistance) of the memristive material may be altered by controlling voltages applied between individual wires of the row and column wires.

Embodiments relate in general to trainable resistive crosspoint devices, (RPUs) and circuit methodology for differential weight reading in resistive processing devices (RPU). More specifically, embodiments relate to method(s) of utilizing current differentials within circuits to generate weight value(s) for weight storage device(s).

Various embodiments provide a resistive processing unit (RPU), including a circuit having at least two current mirrors connected in series, and a capacitor connected with at least two current mirrors, the capacitor providing a weight based on a charge level of the capacitor. The capacitor is charged or discharged by one of the at least two current mirrors.

Certain embodiments indicate that within an RPU device with any suitable weight storage element that can express its weight value in terms of voltage such as capacitor and battery, the respective embodiments can achieve a differential current reading by using two optional methods. One method, uses a constant current source while the other method employs a complimentary current source. The constant current source subtracts reference current from read current, and therefore, the current reading, L can have positive, zero or negative current value. Using the complimentary current source, two current reading elements work in a opposite direction to each other. Using this method, one can increase dynamic range twice that achievable through a single element reading scheme.

FIG. 1 illustrates a block diagram of an example system 100 that can access and process data using variable computing components depicted in accordance with one or more embodiments described herein. The system 100 can facilitate a process of assessing and identifying a large amount of various forms of data, and using machine learning, train a neural network or other type of model. The system 100 can generate predictive recommendations to an individual level resulting in a context in accordance with one or more embodiments described herein. Aspects of systems (e.g., system 100 and the like), apparatuses or processes explained in this disclosure can constitute machine-executable component(s) embodied within machine(s), e.g., embodied in one or more computer readable mediums (or media) associated with one or more machines. Such component(s), when executed by the one or more machines, e.g., computer(s), computing device(s), virtual machine(s), etc. can cause the machine(s) to perform the operations described. Repetitive description of like elements employed in one or more embodiments described herein is omitted for sake of brevity.

System 100 can optionally include a server device, one or more networks and one or more devices (not shown). The system 100 can also include or otherwise be associated with at least one processor 102 that executes computer executable components stored in memory 104. The system 100 can further include a system bus 106 that can couple various components including, but not limited to, an expression component 108 that expresses read current range in an RPU as read current $I_{wmin}$ and $I_{wmax}$. Range for the current is determined by voltage applied to conductance, it is assumed for this purpose that conductance range is $G_{min}$ and $G_{max}$. Block 110 is a constant source component in the circuit that produces constant current which generates a reference current $I_{ref}$ that is utilized in a final active current equation. Block 112 is a computing component that executes specific circuit-based equations related to voltage, resistance and current along with any neural network (NN) required calculations. Weighting component 114 translates the current into a weight, as a negative active net current can produce a negative weight, a positive current can provide a positive weight and a zero or null current can provide a zero weight.

System 100 can be any suitable computing device or set of computing devices that can be communicatively coupled to devices, non-limiting examples of which can include, but are not limited to, a server computer, a computer, a mobile computer, a mainframe computer, an automated testing system, a network storage device, a communication device, a web server device, a network switching device, a network routing device, a gateway device, a network hub device, a network bridge device, a control system, or any other suitable computing device. A device can be any device that can communicate information with the system 100 and/or any other suitable device that can employ information provided by system 100. It is to be appreciated that system 100, components, models or devices can be equipped with communication components (not shown) that enable communication between the system, components, models, devices, etc. over one or more networks.

In accordance with the system 100, memory 104 can store computer executable components executable by processor 102. Expression component 108 can relate to conductance range or the current range as both parameters are related. Transformation of voltage range to current range is to generate potential of a negative current, as resistance cannot be negative. Block 110 can be providing a constant source current to the circuit and can be referred to as $I_{ref}$, the reference current. Current differential can be calculated by computing component 112, which can produce a negative, positive or zero final active current using equation of: I (final active net current)=$I_w$ (device read current)−$I_{ref}$ (reference current), and this result can be converted to a positive, negative or zero weight.

Various components of system 100 can be connected either directly or via one or more networks. Such networks can include wired and/or wireless networks, including, but not limited to, a cellular network, a wide area network (WAN) (e.g., the Internet), or a local area network (LAN), non-limiting examples of which include cellular, WAN, wireless fidelity (Wi-Fi), Wi-Max, WLAN, radio communication, microwave communication, satellite communication, optical communication, sonic communication, or any other suitable communication technology. Moreover, the aforementioned systems and/or devices have been described with respect to interaction between several components. It should be appreciated that such systems and components can include those components or sub-components specified therein, some of the specified components or sub-components, and/or additional components. Sub-components could also be implemented as components communicatively coupled to other components rather than included within parent components. Further yet, one or more components and/or sub-components can be combined into a single component providing aggregate functionality. The components can also interact with one or more other components not specifically described herein for the sake of brevity, but known by those of skill in the art.

The subject computer processing systems, methods apparatuses and/or computer program products can be employed to solve new problems that arise through advancements in technology, computer networks, the Internet and the like.

Figure 2:
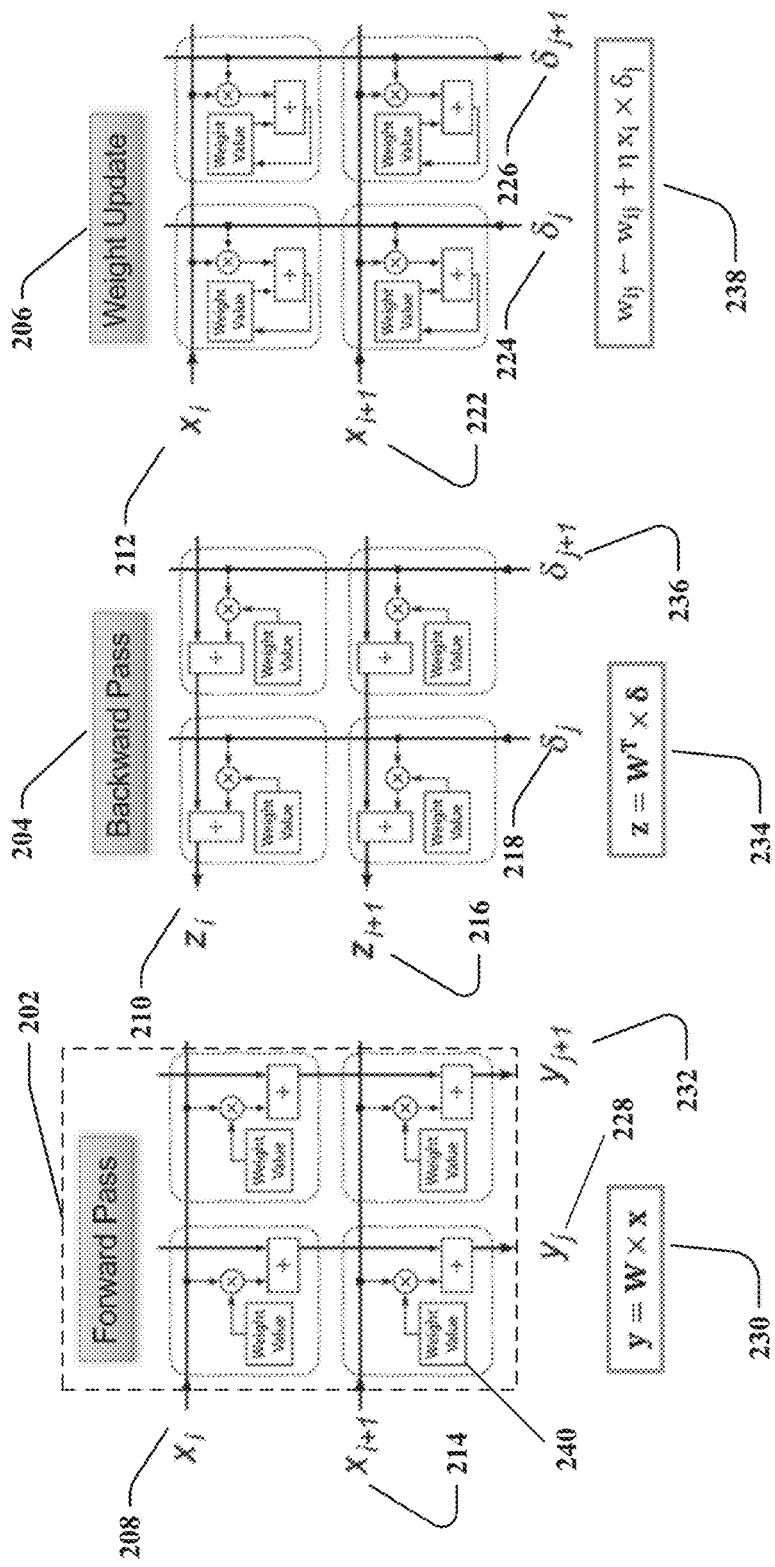
FIG. 2 illustrates the backpropagation algorithm which is composed of three cycles, forward, backward and weight update in accordance with one or more embodiments described herein.

FIG. 2 illustrates a backpropagation algorithm (used to train NN) which is composed of three cycles, forward, backward and weight update in accordance with one or more embodiments described herein. Block 202 shows an example basic architecture of an RPU cell of a crossbar array of memory devices. This device will be discussed further in relation to speed of calculations required by a neural network (NN).

Neural network performance is based on learning data and acting upon that data in a narrow time duration to provide key results requested. There is an algorithm for neural networks called backpropagation algorithm that can be a primary generator of learning in neural networks and can provide detailed insights into how changing weights and biases modifies overall behavior of the network. Novelty of embodiments is not specific to the backward propagation algorithm.

The backpropagation algorithm is composed of three cycles that are key in training of neural networks. The three cycles are forward, backward, and weight update which are repeated many times until a convergence criterion is met. The forward and backward cycles mainly involve computing vector-matrix multiplication in forward and backward directions. This operation can be performed on a two-dimensional (2D) crossbar array of two-terminal resistive. In forward cycle, stored conductance values in the crossbar array form a matrix, where the input vector is transmitted as voltage pulses through each of the input rows. As an example, note the block 202, a (2×2) array example of resistors is shown and is capable of programming the resistors to any value requested. Assuming there is a 2×2 array of resistive memory devices, the resistive memory devices are divided into a weight value 240 and computation units within (shown inside the dashed box). The device can store weight and when a pulse is provided, it can change weight. This can be considered a variable resistor located at a cross-point that allows resistance to be modified. Block 202 depicts four memory devices within a 2×2 array, X (208) and $X_{i+1}$ (214) are input vectors (such as voltage) and W (240) is weight value, the $Y_j$ (228) and $Y_{j+1}$ (232) current value is a result of matrix vector multiplication (230). In digital forum, there is significant amount of computing required to execute these matrix vector multiple calculations. Utilizing these resistive analog memory device arrays, by applying voltage corresponding to the input vector and reading the current at the columns (Y), the computations are completed much faster than the standard method. The key point is with using these crossbar resistive memory devices, the computing of matrix vector multiplication can be done in parallel (mathematical processing for learning) and the performance can be greatly accelerated.

In a backward cycle (204), it works in reverse as the forward cycle, instead of X as input, input voltage pulses are supplied from columns "δ" as an input (218 and 236), then a vector-matrix product is computed on a transpose of a matrix, the result identified as the current Z (210) and $Z_{i+1}$ (216) using equation (234).

The weight update cycle (206) includes calculating a vector-vector outer product that consists of a multiplication operation and an incremental weight update to be performed locally at each cross-point. A corresponding update rule can be expressed as: $W_{ij} \leftarrow W_{ij} + \eta X_i \delta_j$ (238), where Wij represents weight value for an ith row and jth column, $X_i$ (212) and ($X_{i+1}$ at 222) is activity at input neuron, $\delta_j$ (224 and 226) is error computed by an output neuron, and t is global learning rate. The ith row and the jth column intersect at the RPU device. These three computational processes can be executed in parallel, regardless of size of an array which can result in significant improvement in execution speed over convention systems/device/techniques. Embodiments regarding differential reading is applied within these RPU devices.

Figure 3:
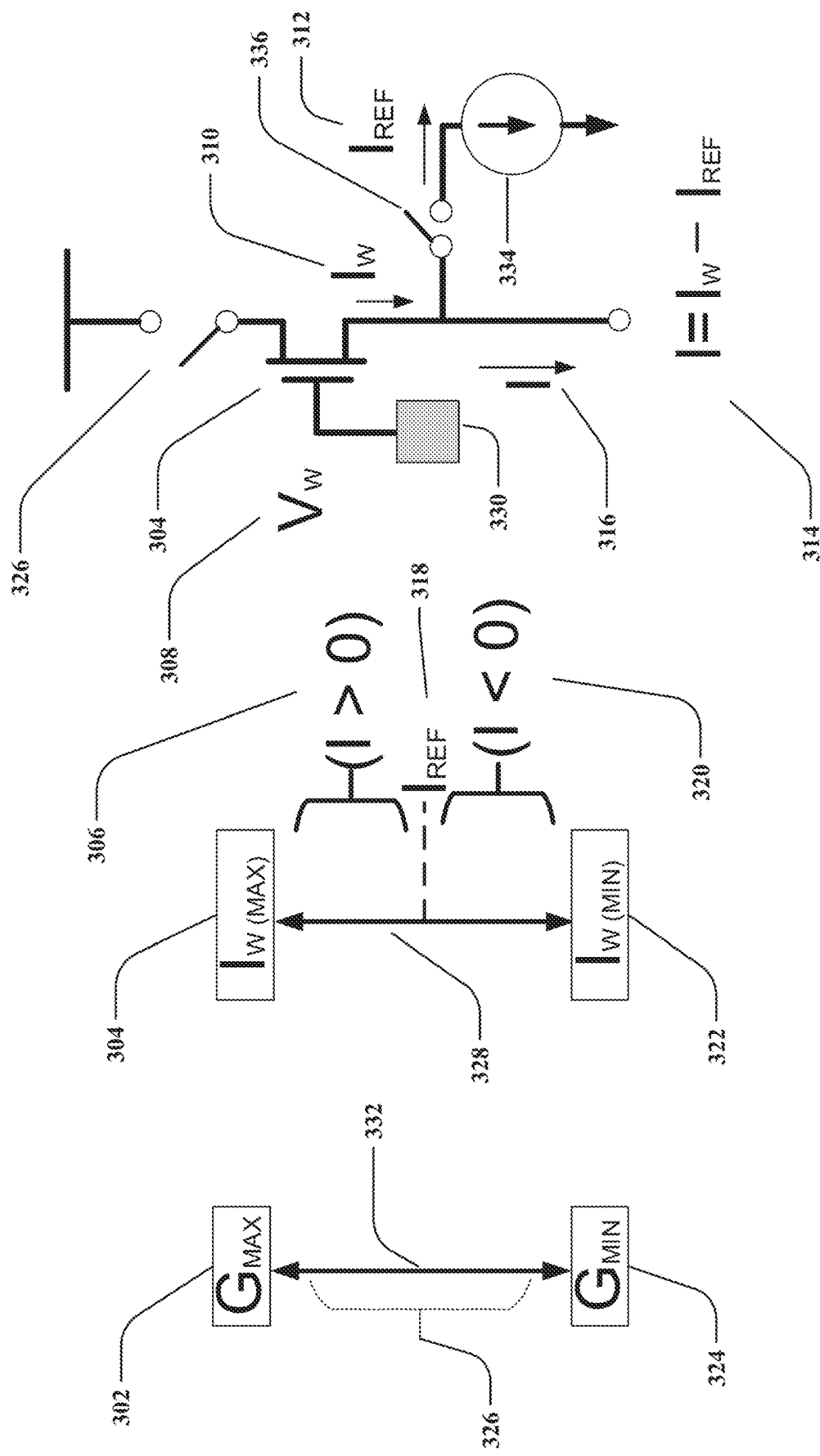
FIG. 3 illustrates the process of the Conductance range (G) and its correlation to the current range (I) with a generic circuit example in accordance with one or more embodiments described herein.

FIG. 3 illustrates a process of conductance range (G) and its correlation to current range (I) with a generic circuit example in accordance with one or more embodiments described herein. As one of the fundamental units for neural networks, weights are used for computations and can be valued as positive, negative and "0" value weights for calculations. If there is a need to program a negative weight value on a variable resistive device, it is not feasible since resistance is always positive, as a resistor cannot be negative. A potential method of obtaining a negative value is by using a reference current. To elaborate on this, reference is made to block 326 which reflects an example of a conductance range for a resistive memory device, identified as $G_{max}$ (302) and $G_{min}$ (324). At or near center of this range, a point can be identified as $G_{ref}$ (332) (or considered a $G_{zero}$ value) that can be translated to a current when voltage is applied. If conductance is greater than Gref, then conductance has a positive weight and if conductance is lower, it has a negative weight. To conduct actual computations, a reference current is required that can be produced by applying a voltage to the resistor. This can generate a range of (328) between device read current of $I_{wmax}$ (304) and $I_{wmin}$ (322), which can correspond to $G_{max}$ and $G_{min}$, and $G_{ref}$ can correspond to $I_{ref}$ (318)(zero current). If current $I_w$ (310) is greater than $I_{ref}$, final active current I (316) can be positive (306) and if $I_w$ is less then $I_{ref}$, final current I can be negative (320). Utilizing reference current ($I_{ref}$) (318) and subtracting that current value from device current ($I_w$) (310) is how final net positive and negative active currents are produced (314). Subsequently these positive and negative currents can correspond to positive and negative weights. To produce a reference current ($I_{ref}$), one method is to provide a current source (334) and connecting it to the circuit. For reading weight, both switches (326 and 336) are closed, then reference current can flow and the equation for acquiring the net current I can be calculated by I=$I_w - I_{ref}$ (314). For this circuit, 304 is an NMOS transistor, 330 is a weight storage device, and $V_w$ (308) is voltage. This is a method of generating a differential current, which allows read of a positive and negative current based on results of the aforementioned equation. The entire circuit is designed to reflect a crosspoint resistive memory device with the weight storage device being either a capacitor or a battery.

FIG. 4 illustrates a method of implementation for differential reading (based on the generic circuit in FIG. 3), which is now using a transistor (412) instead of a current source to generate constant current source ($I_{ref}$) (410). This current can be subtracted from device current ($I_w$) to produce net current (I), in accordance with one or more embodiments described herein. Block 420 is identical to the basic current (I) range circuit from FIG. 3 and the circuit 422 depicts a similar circuit to the transistor circuit in FIG. 3. Notice, the circuit can only function when both the switches (404 and 408) are synchronized and there is a voltage bias applied. (this concept would also apply to the generic circuit in FIG. 3.) When reading cell weight, reference current generator should be connected, and the circuit closed. When there is no voltage applied to this cell, there can be no current to read. Also, the reference voltage can be common for all cells in the array. The same equation (418) for calculating current in the generic circuit in FIG. 3 applies here as well, I (414)=$I_w$ (406)−$I_{ref}$(410). Components are the same as in FIG. 3, 416 is a weight storage device, 402 is an NMOS transistor, a difference being current generator is a constant voltage source ($V_{ref}$) 412.

Figure 5:
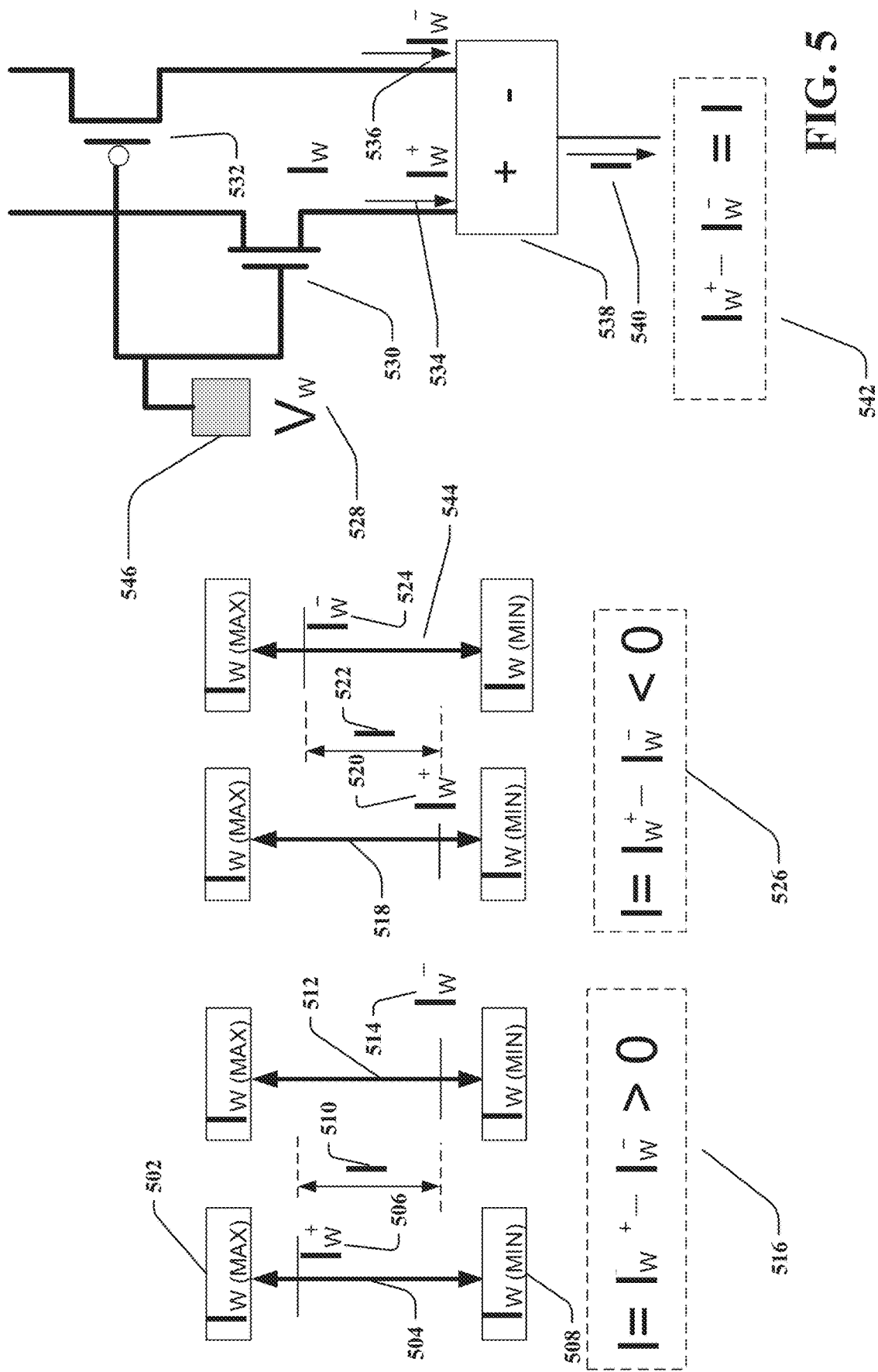
FIG. 5 illustrates a second method for differential reading, which is using 2 current reading elements which work in an opposite direction to each other in accordance with one or more embodiments described herein.

FIG. 5 illustrates a second method for differential reading, employs two current reading elements that work in an opposite direction to each other in accordance with one or more embodiments described herein. In this implementation, a constant current source is not used as in FIGS. 3 and 4, for this method 2 FET's are used for two complimentary reads one N-channel MOSFET (NMOS) (530) and one P-channel MOSFET (PMOS) (532)). Same current parameters are used as previously where top of a range is $I_{max}$ (502) and bottom of the range is $I_{min}$ (508). Then weight storage device (546) is connected to each gate of the FETs, and by changing weight, current for the NMOS and PMOS can change also. The $I_{wmax}$ and $I_{wmin}$ range (504, 512, 518, 544) still applies but now current $I_{w-}$ (514, 524, 536) is a current from a PMOS and $I_{w+}$ (506, 520, 534) is from thane NMOS circuit. When $V_w$ (528) increases, current $I_{w+}$ can increase and $I_{w-}$ can decrease, and if $V_w$ decreases, current $I_{w+}$ can decrease and $I_{w-}$ can increase. Subtracting the two currents ($I_{w+} - I_{w-}$) produces a differential that can result in the net current I (510, 522, 540) which can be positive (516) or negative (526). This negative, positive or zero current corresponds to a same sign as the weight. Block 538 is a circuit integration unit which is responsible for a final calculation to determine I (540). For this implementation, there is no requirement for a $V_{ref}$ value connected to all cells.

Figure 6:
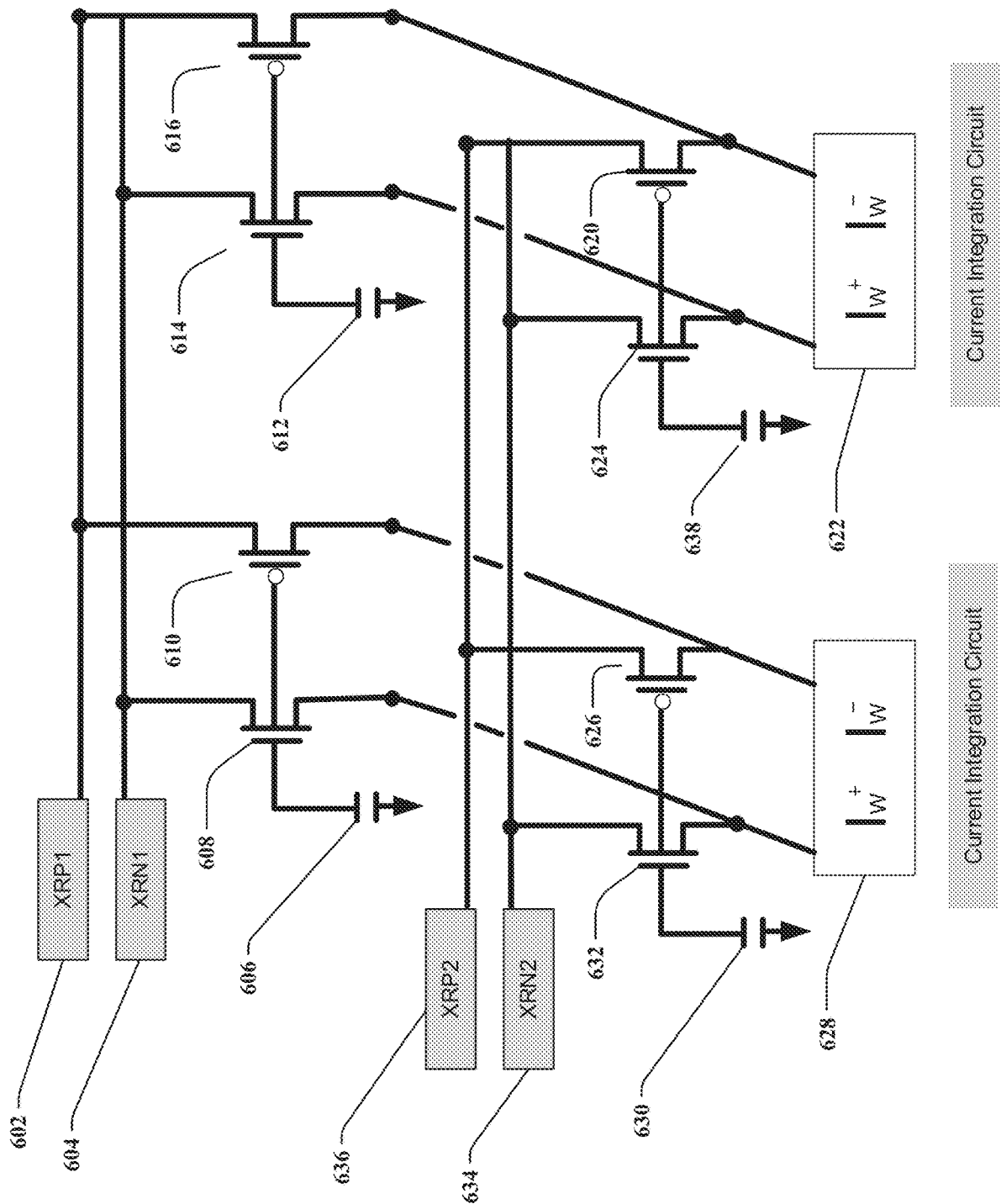
FIG. 6 illustrates an in-peripheral circuit implementation of differential reading in accordance with one or more embodiments described herein.

FIG. 6 illustrates a "in-peripheral circuit" implementation of differential reading in accordance with one or more embodiments described herein. This drawing reflects a more detailed explanation of a 2×2 array using the NMOS and PMOS circuit in FIG. 5. The NMOS transistors are 608, 614, 632 and 624 while the PMOS transistors are 610, 616, 626 and 620. Capacitors in each cell (606, 612, 630 and 638) are weight storage devices in this circuit. When there is a read, a voltage pulse is applied simultaneously to XRP1 (602) (PMOS side) and XRN1 (604) (NMOS side), as the voltage value can be the same or different. The same voltage pulses are applied for the two resistive devices below as depicted in XRP2 (636) (PMOS side) and XRN2 (634) NMOS side. As this occurs, the positive current (I+) can gather and accumulate in each line from each NMOS to the current integration circuit (I+) terminal in 628 and 622. As for the PMOS side, the current can gather and accumulate from each line to the (I−) terminal in the current integration circuit 628 and 622. Within this current integration circuit, the computation of the positive and negative current is calculated to produce the net current I. This current can correspond to the weight as explained previously.

Figure 7:
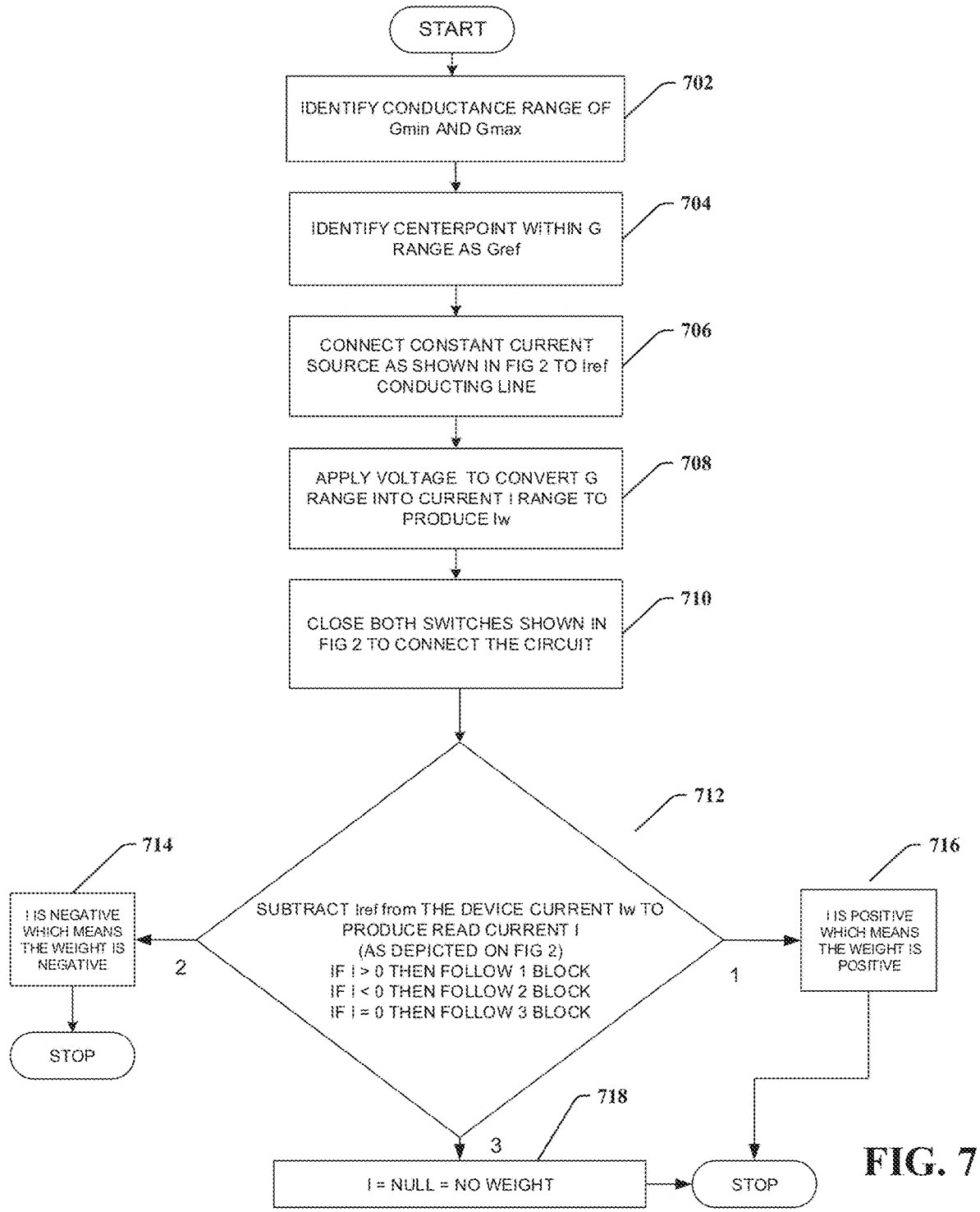
FIG. 7 illustrates a process flowchart of the method to read differential weight in a RPU in accordance with one or more embodiments described herein.

FIG. 7 illustrates a process flowchart of a method to read differential weight in an RPU in accordance with one or more embodiments described herein. Block 702 starts with defining a range for conductance between $G_{min}$ and $G_{max}$. This can be a maximum conductance for the circuit along with the basic minimum. A center point between $G_{max}$ and $G_{min}$ is identified as $G_{ref}$(704). The circuit in FIG. 2 provides the next step, (706) as there needs to be a constant current source connected to the circuit to generate a reference current that can be compared to the device current. For the purpose of generating a "signed" weight value, conductance value can be changed to a corresponding current value as resistance in a circuit cannot be negative. This way, a positive, negative or zero current can result using the differential computations and provide a "signed" weight reflective of the current. There can be a voltage (708) applied to conductance to provide a corresponding current range. The circuit is still not viable until both switches are closed to produce current flow (710). When the circuit is closed, the weight read can be made by using equation: $I=I_w-I_{ref}$ (712) where $I_w$ is device current, $I_{ref}$ is reference current provided by the constant current source and I is net active current produced from the equation. If the final active net current is positive (716) then the weight can be positive, if the active net current is negative (714) then the weight can be negative, and if the final active current is zero, the weight is zero (718) or null.

Figure 8:
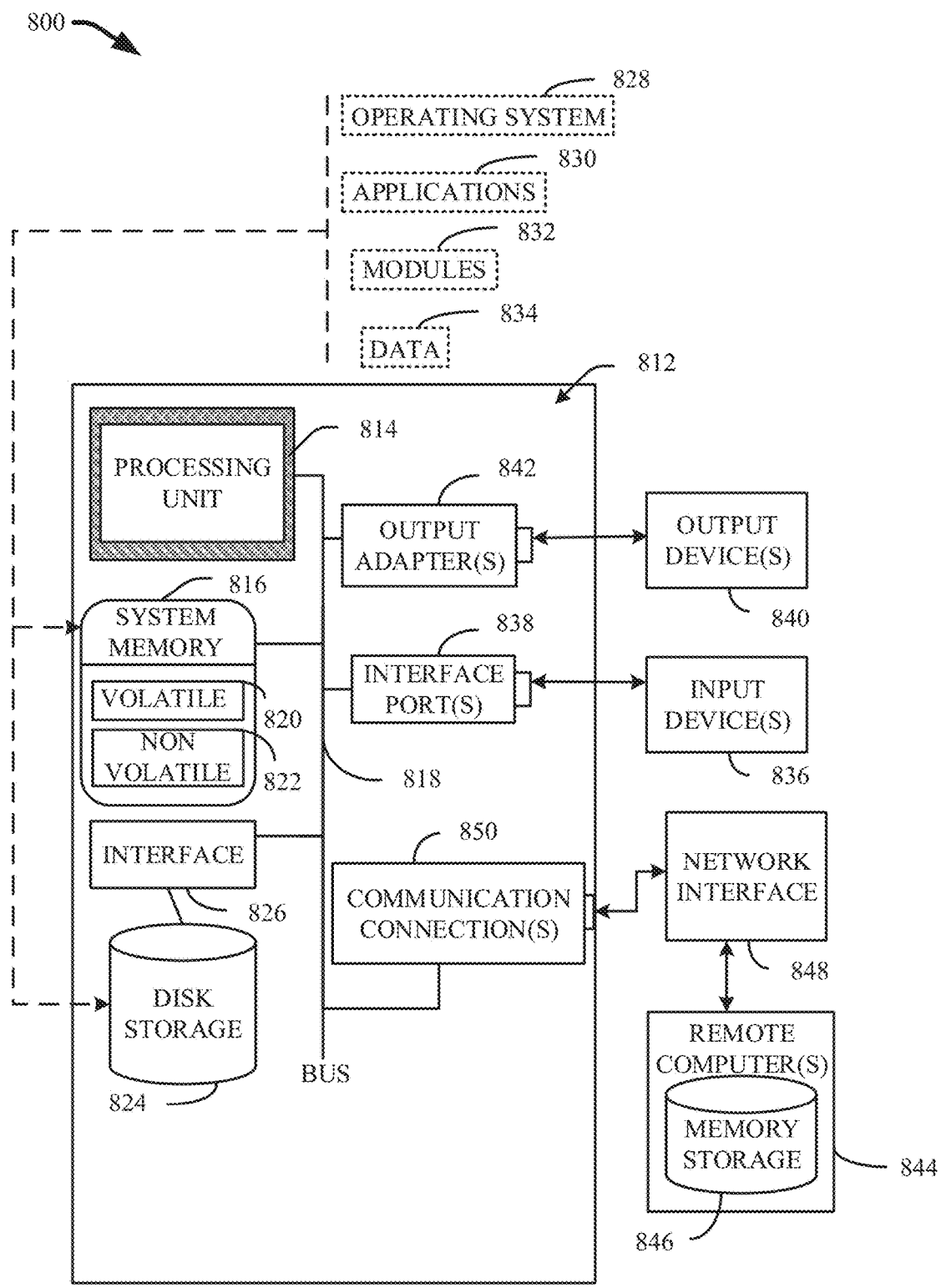
FIG. 8 is a schematic diagram of an example operating environment in accordance with one or more implementations described herein.

Turning to FIG. 8, a suitable operating environment 800 for implementing various aspects of this disclosure can also include a computer 812. The computer 812 can also include a processing unit 814, a system memory 816, and a system bus 818. The system bus 818 couples system components including, but not limited to, the system memory 816 to the processing unit 814. The processing unit 814 can be any of various available processors. Dual microprocessors and other multiprocessor architectures also can be employed as the processing unit 814. The system bus 818 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1084), and Small Computer Systems Interface (SCSI). The system memory 816 can also include volatile memory 820 and nonvolatile memory 822. The basic input/output system (BIOS), containing the basic routines to transfer information between elements within the computer 812, such as during start-up, is stored in nonvolatile memory 822. By way of illustration, and not limitation, nonvolatile memory 822 can include read only memory (ROM), programmable ROM (PROM), electrically programmable ROM (EPROM), electrically erasable programmable ROM (EEPROM), flash memory, or nonvolatile random-access memory (RAM) (e.g., ferroelectric RAM (FeRAM). Volatile memory 820 can also include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 812 can also include removable/non-removable, volatile/non-volatile computer storage media. FIG. 8 illustrates, for example, a disk storage 824. Disk storage 824 can also include, but is not limited to, devices like a magnetic disk drive, floppy disk drive, tape drive, Jaz drive, Zip drive, LS-100 drive, flash memory card, or memory stick. The disk storage 824 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 824 to the system bus 818, a removable or non-removable interface is typically used, such as interface 826. FIG. 8 also depicts software that acts as an intermediary between users and the basic computer resources described in the suitable operating environment 800. Such software can also include, for example, an operating system 828. Operating system 828, which can be stored on disk storage 824, acts to control and allocate resources of the computer 812. System applications 830 take advantage of the management of resources by operating system 828 through program modules 832 and program data 834, e.g., stored either in system memory 816 or on disk storage 824. It is to be appreciated that this disclosure can be implemented with various operating systems or combinations of operating systems. A user enters commands or information into the computer 812 through input device(s) 836. Input devices 836 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 814 through the system bus 818 via interface port(s) 838. Interface port(s) 838 include, for example, a serial port, a parallel port, a game port, and a universal serial bus (USB). Output device(s) 840 use some of the same type of ports as input device(s) 836. Thus, for example, a USB port can be used to provide input to computer 812, and to output information from computer 812 to an output device 840. Output adapter 842 is provided to illustrate that there are some output devices 840 like monitors, speakers, and printers, among other output devices 840, which require special adapters. The output adapters 842 include, by way of illustration and not limitation, video and sound cards that provide a means of connection between the output device 840 and the system bus 818. It should be noted that other devices and/or systems of devices provide both input and output capabilities such as remote computer(s) 844.

Computer 812 can operate in a networked environment using logical connections to one or more remote computers, such as remote computer(s) 844. The remote computer(s) 844 can be a computer, a server, a router, a network PC, a workstation, a microprocessor-based appliance, a peer device or other common network node and the like, and typically can also include many or all the elements described relative to computer 812. For purposes of brevity, only a memory storage device 846 is illustrated with remote computer(s) 844. Remote computer(s) 844 is logically connected to computer 812 through a network interface 848 and then physically connected via communication connection 850. Network interface 848 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 850 refers to the hardware/software employed to connect the network interface 848 to the system bus 818. While communication connection 850 is shown for illustrative clarity inside computer 812, it can also be external to computer 812. The hardware/software for connection to the network interface 848 can also include, for exemplary purposes only, internal and external technologies such as, modems including regular telephone grade modems, cable modems and DSL modems, ISDN adapters, and Ethernet cards.

Embodiments of the present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in one or more computing/processing device receives computer readable program instructions from the network and forwards the computer readable program instructions for storage in a computer readable storage medium within the respective computing/processing device. Computer readable program instructions for carrying out operations of various aspects of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to customize the electronic circuitry, to perform aspects of the present invention.

Aspects of the present invention are described herein with reference to flowchart illustrations and/or block diagrams of methods, apparatus (systems), and computer program products according to embodiments of the invention. It will be understood that one or more blocks of the flowchart illustrations and/or block diagrams, and combinations of blocks in the flowchart illustrations and/or block diagrams, can be implemented by computer readable program instructions. These computer readable program instructions can be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, one or more blocks in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that one or more block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments where tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a server computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random-access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems, computer program products, and computer-implemented methods. It is, of course, not possible to describe every conceivable combination of components, products and/or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system and apparatus, comprising:
a memory that stores computer-executable components;
a processor, operably coupled to the memory, that executes the computer-executable components stored in the memory, wherein the computer-executable components comprise:
an expression component that expresses read current range in a resistive processing unit (RPU) as read current within and including $I_{wmin}$ and $I_{wmax}$;
a constant current source component that generates a reference current $I_{ref}$;
a computing component that subtracts the reference current value from a read current value within the RPU to generate an active net current read value; and
a weighting component that analyzes the active net current read value and assigns it a negative, positive or "0" weight.

2. The system of claim 1, wherein a weight storage element can express its weight value in terms of capacitor voltage or battery voltage.

3. The system of claim 1, wherein the weight storage device is connected to a gate of a MOSFET transistor.

4. The system of claim 2 wherein $G_{max}$ and $G_{min}$ represent a conductive range of a resistive memory device.

5. The system of claim 4 wherein a reference center point ($G_{ref}$) between $G_{max}$ and $G_{min}$ a is identified as a ZERO value.

6. The system of claim 5 wherein if G (conductance) is $>G_{ref}$ then the weight value is a positive.

7. The system of claim 5, wherein if G (conductance)$<G_{ref}$ then the weight value is negative.

8. The system of claim 5, wherein $G_{max}$ is converted to $I_{max}$, and $G_{min}$ is converted to $I_{min}$ by applying a voltage.

9. The system of claim 5, wherein $I_{ref}$ is at a median value of $I_{max}$ and $I_{min}$ and corresponds to the $G_{ref}$ value.

10. The system of claim 1 wherein the active net current $I=I_w-I_{ref}$.

11. A computer-implemented method, comprising:
expressing, by a processor operatively coupled to a memory, read current range in a resistive processing unit (RPU) as read current $I_{wmin}$ and $I_{wmax}$;
employing by the processor two FETs that work in opposite direction to each other to drive a current read differential that produces $I_{w+}$ and $I_{w-}$;
calculating, by the processor, net active current I as $(I_{w+}-I_{w-})$; and
analyzing, by the processor, net active current value and assigning it to a negative, positive or "0" weight.

12. The method of claim 11, wherein a dynamic range of the net active current I is two times $(I_{wmax}-I_{wmin})$ Amps.

13. The method of claim 11, wherein $I_{w+}$ is generated by a NMOS FET.

14. The method of claim 13, wherein $I_{w-}$ is generated by a PMOS FET.

15. The method of claim 14, wherein a voltage pulse is applied simultaneously to respective gates of the NMOS FET and the PMOS FET.

16. The method of claim 11, wherein a final net active current is $I=(I_{w+}-I_{w-})$.

17. A computer program product, comprising a computer readable storage medium having program instructions embodied therewith, the program instructions executable by a processor to cause the processor to:
read, by the processor, current range in a resistive processing unit (RPU) as read current Iwmin and Iwmax;
provide, by the processor, a current source component that generates a reference current $I_{ref}$;
using the processor, to subtract the reference current value from a read current value within the RPU to generate an active net current read value; and
analyze, by the processor, the active net current read value and assign it a negative, positive or "0" weight.

18. The computer program product of claim 17, wherein a weight storage element expresses its weight value in terms of capacitor voltage or battery voltage or is connected to a gate of a MOSFET transistor.

19. The system of claim 17, wherein $G_{max}$ and $G_{min}$ represent a conductive range of the RPU.

20. The system of claim 17, wherein $G_{max}$ is converted to $I_{max}$, and $G_{min}$ is converted to $I_{min}$ by applying a voltage.

* * * * *